United States Patent
Sie et al.

(10) Patent No.: US 9,012,300 B2
(45) Date of Patent: Apr. 21, 2015

(54) MANUFACTURING METHOD FOR A SHALLOW TRENCH ISOLATION

(71) Applicant: United Microelectronics Corp., Hsin-Chu (TW)

(72) Inventors: Wu-Sian Sie, Tainan (TW); Chun-Wei Hsu, Taipei (TW); Chia-Lung Chang, Tainan (TW); Chih-Hsun Lin, Ping-Tung County (TW); Chang-Hung Kung, Kaohsiung (TW); Yu-Ting Li, Chiayi (TW); Wei-Che Tsao, Tainan (TW); Yen-Ming Chen, New Taipei (TW); Chun-Hsiung Wang, Kaohsiung (TW); Chia-Lin Hsu, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/633,104

(22) Filed: Oct. 1, 2012

(65) Prior Publication Data

US 2014/0094017 A1 Apr. 3, 2014

(51) Int. Cl.
*H01L 21/76* (2006.01)
*H01L 21/762* (2006.01)

(52) U.S. Cl.
CPC .... *H01L 21/76232* (2013.01); *H01L 21/76229* (2013.01)

(58) Field of Classification Search
CPC ............ H01L 27/762; H01L 21/76811; H01L 21/76283
USPC ......................... 438/400, 405, 424–438, 444; 257/E21.546, E21.54, E21.58
See application file for complete search history.

(56) References Cited

U.S. PATENT DOCUMENTS

| | | | |
|---|---|---|---|
| 5,950,090 A | 9/1999 | Chen | |
| 6,043,138 A | 3/2000 | Ibok | |
| 6,372,605 B1 | 4/2002 | Kuehne | |
| 6,509,232 B1 | 1/2003 | Kim | |
| 6,528,389 B1 * | 3/2003 | Allman et al. | 438/424 |
| 6,670,275 B2 | 12/2003 | Lee | |
| 6,828,208 B2 * | 12/2004 | Lin et al. | 438/400 |
| 7,030,430 B2 | 4/2006 | Doczy | |
| 7,084,025 B2 | 8/2006 | Phua | |
| 7,153,755 B2 | 12/2006 | Liu | |
| 7,208,366 B2 | 4/2007 | Tsai | |
| 7,384,880 B2 | 6/2008 | Brask | |
| 7,521,324 B2 | 4/2009 | Ohmi | |
| 7,541,259 B2 * | 6/2009 | Yi | 438/431 |
| 7,592,270 B2 | 9/2009 | Teo | |
| 7,601,648 B2 | 10/2009 | Chua | |
| 7,824,990 B2 | 11/2010 | Chang | |
| 2004/0266182 A1 | 12/2004 | Ku | |
| 2005/0158966 A1 * | 7/2005 | Fang et al. | 438/427 |
| 2005/0202624 A1 | 9/2005 | Li | |
| 2007/0132056 A1 * | 6/2007 | Williams | 257/510 |
| 2007/0178660 A1 * | 8/2007 | Miller et al. | 438/424 |

(Continued)

*Primary Examiner* — Julia Slutsker
(74) *Attorney, Agent, or Firm* — Winston Hsu; Scott Margo

(57) ABSTRACT

A manufacturing method for a shallow trench isolation. First, a substrate is provided, a hard mask layer and a patterned photoresist layer are sequentially formed on the substrate, at least one trench is then formed in the substrate through an etching process, the hard mask layer is removed. Afterwards, a filler is formed at least in the trench and a planarization process is then performed on the filler. Since the planarization process is performed only on the filler, so the dishing phenomenon can effectively be avoided.

8 Claims, 4 Drawing Sheets

(56) References Cited

U.S. PATENT DOCUMENTS

| | | |
|---|---|---|
| 2009/0200494 A1 | 8/2009 | Hatem |
| 2009/0289284 A1 | 11/2009 | Goh |
| 2010/0075507 A1 | 3/2010 | Chang |
| 2010/0117188 A1* | 5/2010 | Waldrab et al. ............... 257/506 |
| 2010/0184281 A1 | 7/2010 | Hsu |

* cited by examiner

MANUFACTURING METHOD FOR A SHALLOW TRENCH ISOLATION

BACKGROUND OF THE INVENTION

1. Field of the Invention

The present invention relates to manufacturing method for a semiconductor device, in particular, a method for forming a shallow trench isolation.

2. Description of the Prior Art

In semiconductor processes, in order to provide good electrical isolation and to avoid short-circuits between electric devices on a wafer, a localized oxidation isolation (LOCOS) process, or a shallow trench isolation (STI) process is used to insolate and protect the devices. Since the field oxide layer of the LOCOS process consumes a great part of the wafer area, and bird's beak can occur when growing the field oxide, an STI process is typically used in the semiconductor processes when the line width is small. An STI process involves first forming a shallow trench between each device, and then filling the trench with an insulating material to obtain an electrical isolation effect between each device.

The conventional manufacturing method to form a shallow trench isolation is shown in FIG. 1. First, a pad oxide layer 12 is formed on the surface of a substrate 10, a silicon nitride (SiN) layer 14 is then formed on the pad oxide layer 12, wherein the SiN layer 14 is used as a hard mask layer, and a patterned photoresist layer (not shown) is formed on the SiN layer 14. Afterwards, an etching process is then carried out to form a trench 20 in the substrate that is not covered by the patterned photoresist layer. The patterned photoresist layer is then removed, and a deposition process, such as a chemical vapor deposition (CVD), is performed to form a filler 24 in the trench 20 which covers the SiN layer 14 and wherein the filler includes silicon oxide ($SiO_2$), a planarization process such as chemical mechanical polishing (CMP) is then carried out to complete a shallow trench isolation (STI).

However, during the planarization process, the grinded level can not be lower than the top of the SiN layer 14, therefore, the height of the STI from the surface of the substrate is limited by the height of the SiN layer 14. Besides, when the planarization process is performed on a large area STI, the etching rate of the STI in the central region is faster than in the periphery region, hence a dishing phenomenon will occur, thereby influencing the quality of the STI.

SUMMARY OF THE INVENTION

To solve the above mentioned problems, the present invention provides a method for forming a shallow trench isolation. First, a substrate is provided, then a hard mask layer and a first patterned photoresist layer are sequentially formed on the substrate. Afterwards, at least one trench is formed in the substrate through an etching process, the hard mask layer is removed, and a filler is formed at least in the trench after the hard mask layer is removed.

The feature of the invention is that the filler is formed in the trench after the hard mask layer is removed. This not only prevents the dishing phenomenon from occurring, but the height of the STI is also not limited by the height of the hard mask layer anymore, thereby making the component application more flexible.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 2:
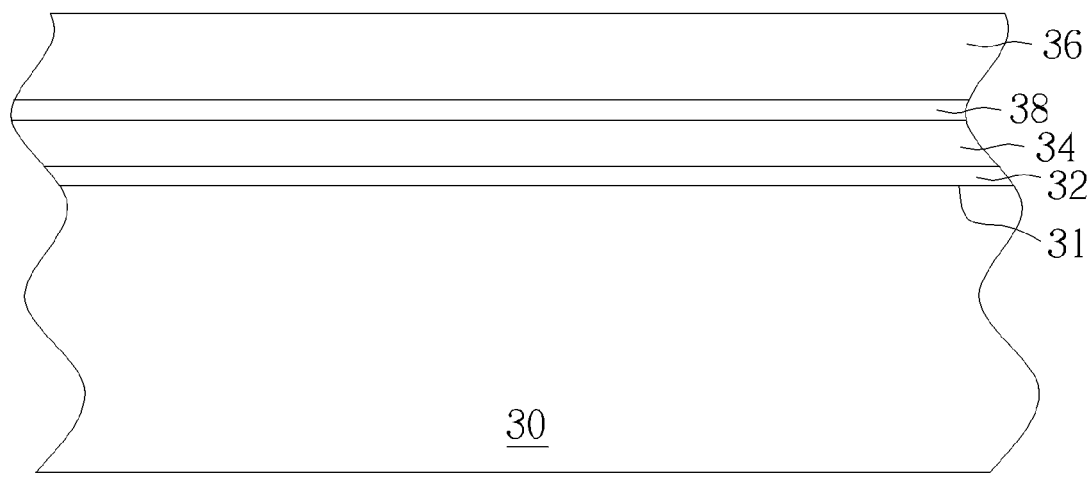
FIGS. 2-8 are schematic, cross-sectional view diagrams showing a method for fabricating a shallow trench isolation according to the first preferred embodiment of the present invention.

Please refer to FIGS. 2~8. FIGS. 2-8 are schematic, cross-sectional view diagrams showing a method for fabricating a shallow trench isolation according to the first preferred embodiment of the present invention. As shown in FIG. 2, a substrate 30 having a top surface 31 is provided, a hard mask layer 34 is formed on the substrate 30, wherein the substrate 30 may be a semiconductor substrate, such as a silicon substrate, a silicon containing substrate, a III-V group-on-silicon (such as GaN-on-silicon) substrate, a grapheme-on-silicon substrate or a silicon-on-insulator (SOI) substrate. The hard mask layer 34 comprises a single layer structure, such as a silicon nitride (SiN) layer, or a multiple layer structure, such as a silicon nitride-silicon oxide-advanced pattern film (APF)-dielectric anti-reflection coating-silicon oxide stacked layer, but not limited thereto. Besides, a liner 32 can be selectively formed between the substrate 30 and the hard mask layer 34; the liner 32 includes a pad oxide layer or a multiple structure layer. In this embodiment, the thickness of the liner 32 is preferred to be about 100 Angstroms, but not limited thereto.

A photoresist layer 36 is then formed on the hard mask layer 34, wherein the photoresist layer 36 may be a single layer structure, or a multiple layer structure such as a stacked layer consisting of a bottom photoresist, a middle photoresist and a top photoresist, wherein the bottom photoresist may be a positive photoresist or a negative photoresist and may include an organic material, such as an I-line photoresist layer. As known by persons of ordinary skills in the art, the I-line photoresist layer is more sensitive to waves with a wavelength of 365 nm. The middle photoresist may be a silicon-containing hard-mask bottom anti-reflection coating layer (SHB), including an organ-silicon polymer or polysilane. The top photoresist may be a positive photoresist or a negative photoresist, such as an ArF photoresist layer to be used for exposures to waves with a 193 nm wavelength. Besides, a bottom anti-reflective coating (BARC) layer 38 can selectively be formed between the hard mask layer 34 and the photoresist layer 36, but not limited thereto.

Figure 3:
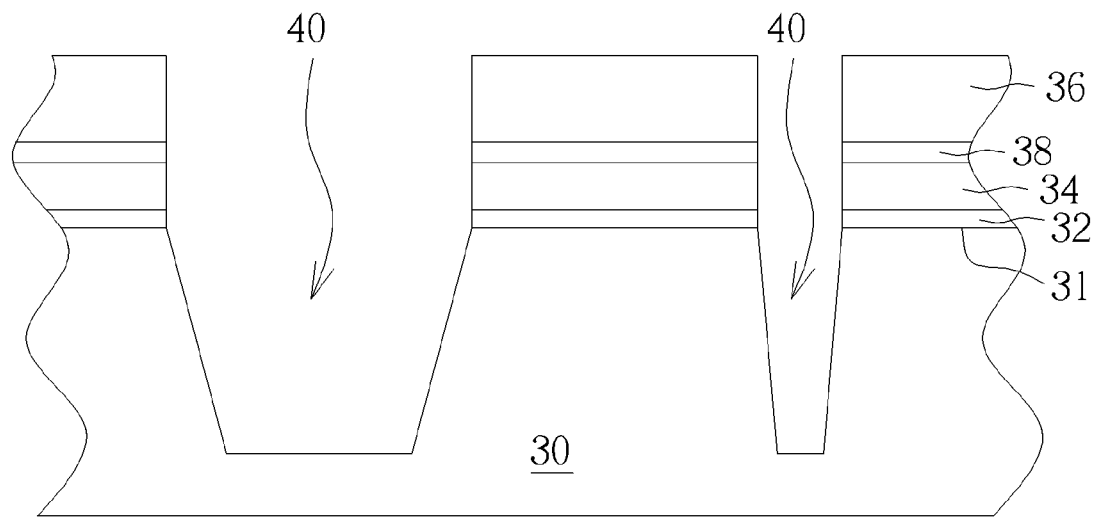
Figure 4:
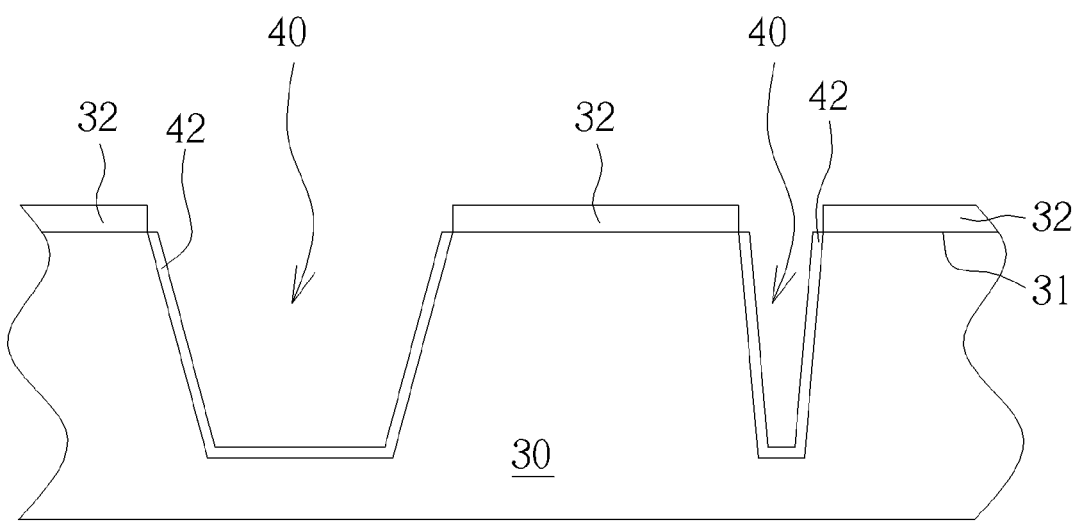

As shown in FIGS. 3~4, a photo-etching process is preformed. For example, a photolithography process is performed to pattern the photoresist layer 36, and the patterned photoresist layer 36 is used as a protective layer. An etching process is performed to remove parts of the BARC layer 38, the hard mask layer 34, the liner 32 and the substrate 30 that are not covered by the patterned the photoresist layer 36, so as to form at least one trench 40 in the substrate 30.

Afterwards, the rest of the photoresist layer 36, the BARC layer 38 and the hard mask layer 34 disposed on the substrate 30 are removed. A liner 42 can then be selectively formed on the exposed surface of the trench 40, wherein the material of the liner 42 is preferably similar to that of the liner 32 disposed on the substrate 30, such as a silicon oxide layer, but not limited thereto. The liner 42 can be formed through a thermal oxidation process; hence it will be formed on the exposed silicon surface, as shown in FIG. 4. In addition, the liner 42 can also be formed through a deposition process, so the liner 42 will therefore entirely cover the surface of each trench 40 and the liner 32.

It is worth noting that in the process shown in FIG. 3 to form the trench 40 mentioned above, the photoresist layer 36 is used as a protective layer. But in the present invention, the hard mask layer 34 can be selectively used as the protective layer too. In other words, after the photoresist layer 36 is patterned through a photolithography process, the pattern is then transferred from the photoresist layer 36 to the hard mask layer 34 to form a patterned hard mask layer 34, and the photoresist layer 36 is then removed. The patterned hard mask layer 34 is used as a protective layer, and another etching process is then performed to form the trench 40 in the substrate 30 that is not covered by the hard mask layer 34. Afterwards, the rest of the hard mask layer 34 disposed on the substrate 30 is removed, and the liner 42 is selectively formed on the exposed surface of the trench 40. This process step is included in the scope of the present invention.

Figure 5:
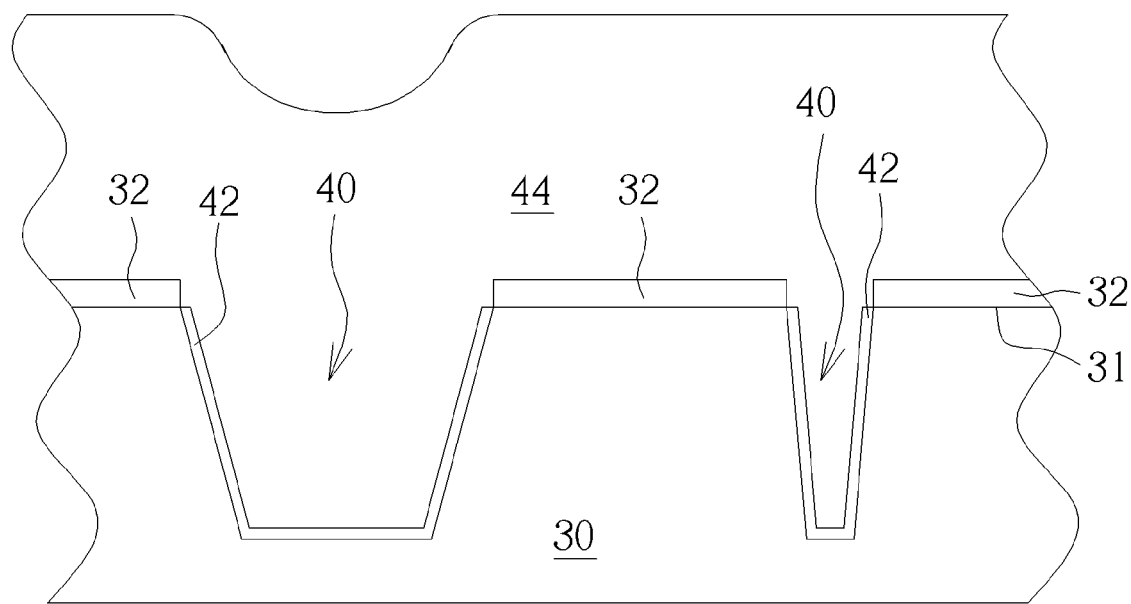

After the hard mask layer 34 is removed, as shown in FIG. 5, a filler 44 is then formed in each trench 40. This embodiment preferably uses a sub-atmospheric chemical vapor deposition (SACVD) or a high density plasma chemical vapor deposition (HDPCVD) to form the filler 44 in the trenches 40. The filler 44 may therefore also be disposed on the surface of the substrate 30, wherein the material of filler 44 includes silicon oxide or others insulating materials. Besides, the deposition height of the filler 44 is preferred to be comprised between 3500~7000 Angstroms, and the environment temperature is preferred to be comprised between 700° C.~1200° C., but not limited thereto, wherein the height of the filler 44 represents the vertical distance from the top surface 31 to the top of the filler 44. Those above mentioned parameters may be adjusted according to the manufacturing process.

Figure 6:
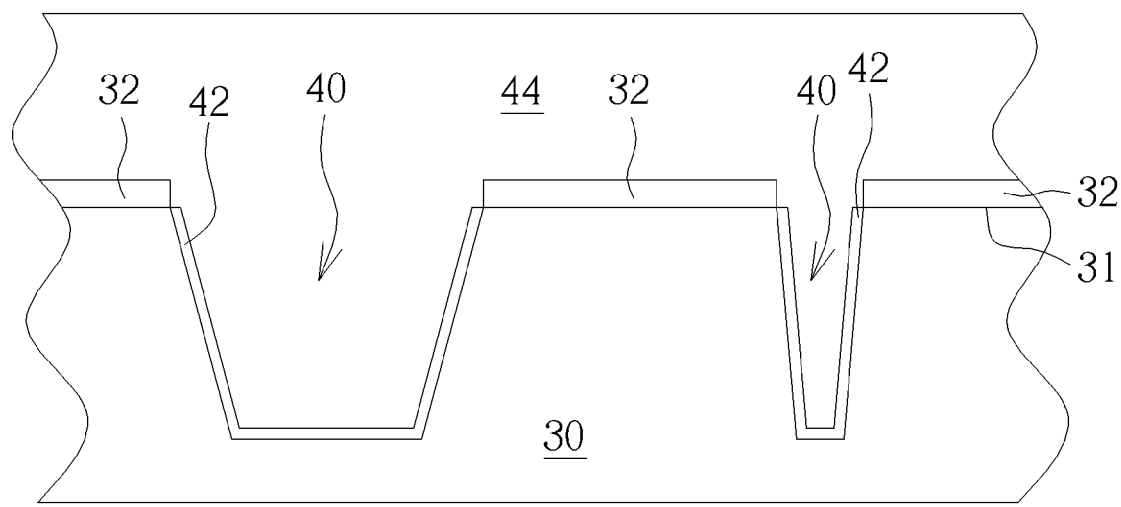

As shown in FIG. 6, a planarization process, such as a chemical mechanical polishing (CMP), is performed to grid and planarize the filler 44. After the planarization process, the height of the filler 44 is preferred to be comprised between 50~100 Angstroms, but not limited thereto.

Figure 1:
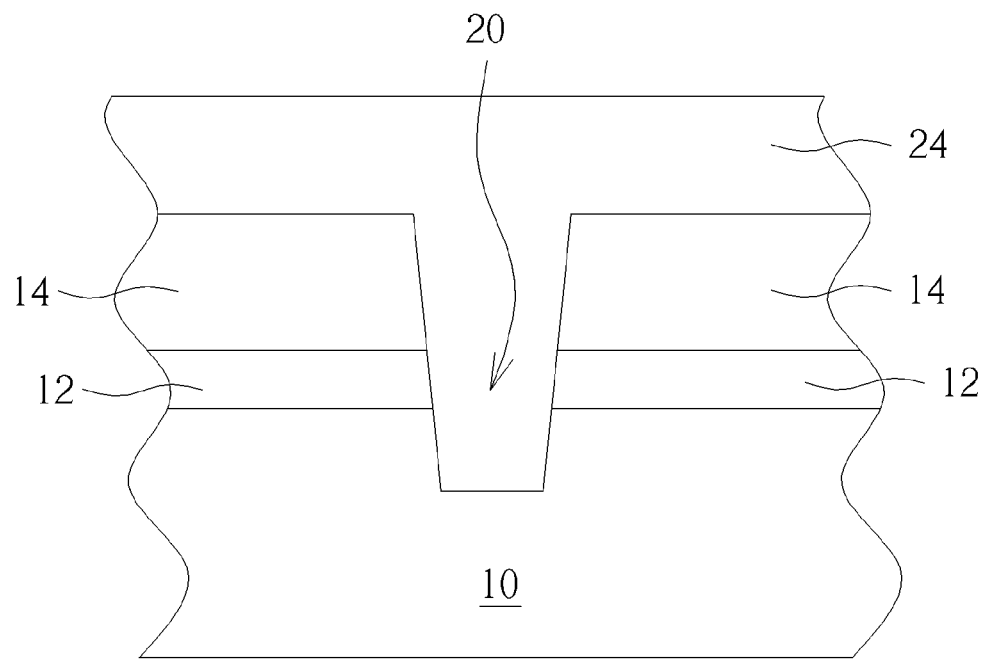
FIG. 1 illustrates a conventional manufacturing method to form a shallow trench isolation.

Unlike in the conventional manufacturing process for forming an STI shown in FIG. 1, the SiN layer (the hard mask layer) 14 disposed on the substrate 10 of the conventional process is not removed during the formation of the filler 24, hence the SiN layer 14 and the filler 24 exist on the substrate 30 simultaneously. During the planarization step, the filler 24 is stopped on the SiN layer 14, therefore the height of the filler 24 is limited by the height of the SiN layer 14. Usually, the height of the SiN layer 14 is about 800~1000 Angstroms, so after the planarization process is performed, the height of the filler 24 protrudes out of the surface of the substrate 10 about 800~1000 Angstroms also. In conventional processes, in order to decrease the height of the filler 24, another etching back process may be performed. In addition, planarization processes such as CMP may use some specific solvent or some specific particles to etch or to grind the surface needed to be planarized. Due to the etching rate and the grinding rate of the filler 24 being different from the etching rate and the grinding rate of the SiN layer 14, the filler 24 will be etched (or be grinded) faster than the SiN layer 14, so a dishing phenomenon is likely to occur easily on the filler 24, particularly when the area of the trench is large. In another way, the hard mask layer 34 disposed on the substrate 30 is removed first, the filler 44 is then formed in the trench 40. In other words, only one material needs to be planarized and grinded during the planarization process, i.e. the filler 44 disposed on the substrate 30 and in the trench 40. This way avoids two or more materials disposed on the substrate 30 to be grinded simultaneously, thereby avoiding the dishing phenomenon occurring on the large area trench 40. Similarly, the height of filler 44 will not be limited by the height of the hard mask layer 34, the filler 44 can be directly grinded until reaching the height needed through the CMP, and does not need an etching back process to decrease the height of the filler 44. In conventional processes, the CMP slurry usually includes cerium oxide, since the slurry has high selectively to silicon nitride and silicon oxide. In the present invention, since only one material needs to be grinded, the CMP slurry may includes silica or alumina, but not limited thereto. The slurry composition can be adjusted according to the process requirements.

Figure 7:
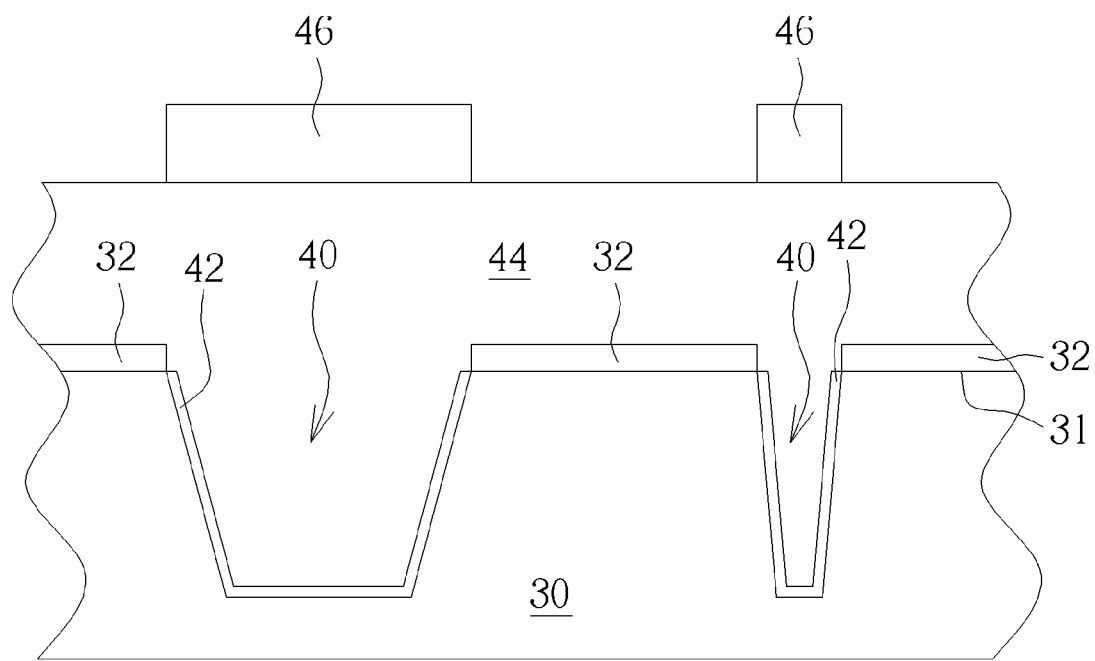
Figure 8:
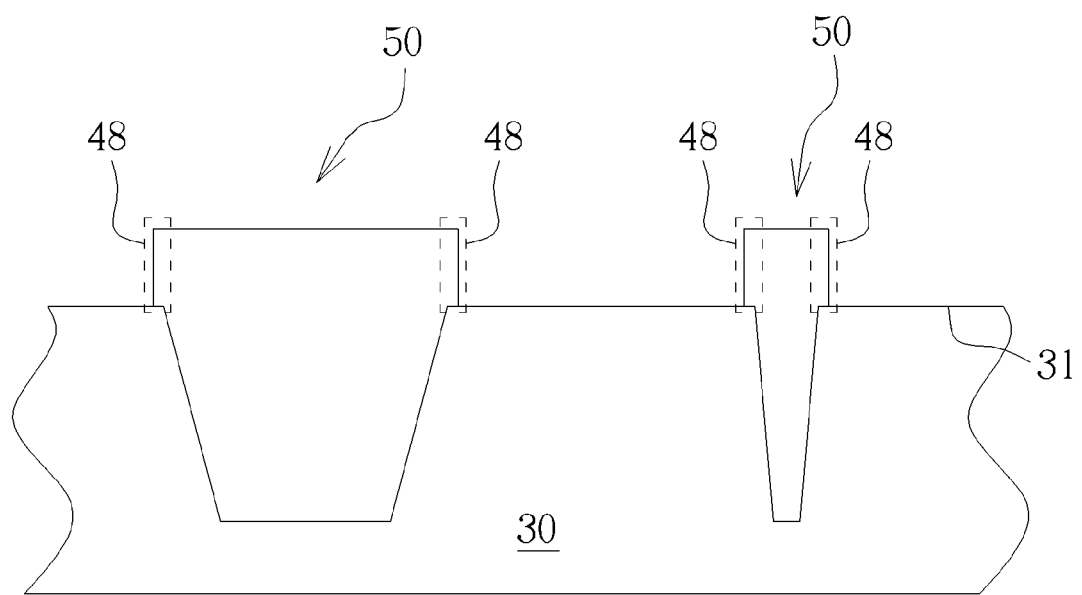

Finally, as shown in FIGS. 7~8, a patterned second photoresist layer 46 is disposed on the filler 44, wherein the patterned second photoresist layer 46 is disposed correspondingly to each trench 40 to protect the filler 44 in each trench 40. Another etching process is then performed to remove the rest of the filler 44 that is not covered by the second photoresist layer 46 to isolate each trench 40 and to complete a plurality of STIs 50 of the present invention. It is worth noting that each width of the patterned second photoresist layer 46 is preferably larger than each width of the trench 40. This way, the filler 44 will form a jut portion 48, wherein the jut portion 48 covers the surrounding region of each corresponding trench 40. When some etching processes are performed to form others electrical components like transistors in following steps, the jut portion 48 can protect the STI 50 from being etched as well.

To summarize the above descriptions, the present invention provides a method for forming a shallow trench isolation, wherein after the trench is formed, the hard mask layer is removed, and the filler is formed in the trench. Therefore, during the planarization processes of following steps, only one material needs to be grinded, which not only avoids the dishing phenomenon, but also allows the height of the STI to be not limited by the height of the hard mask layer, thereby making the manufacturing process more flexible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a shallow trench isolation (STI), comprising:
providing a substrate, a hard mask layer and a first patterned photoresist layer sequentially formed on the substrate;
forming at least one trench in the substrate through an etching process;
removing the hard mask layer;
forming a filler at least in the at least one trench after the hard mask layer is removed;
performing a planarization process on the filler to form a flat surface, and
etching parts of the filler by using a second patterned photoresist layer as a protection layer, so as to expose parts of the substrate, wherein the second patterned photoresist layer is formed on the flat surface after the planarization process is performed, and disposed right above the at least one trench, and an area of the second patterned photoresist layer is larger than an area of the at least one trench.

2. The method of claim 1, further comprising removing the first patterned photoresist layer before the trench is formed.

3. The method of claim 2, wherein the hard mask layer is used as a protection layer during the etching process.

4. The method of claim 1, further comprising removing the first patterned photoresist layer after the trench is formed.

5. The method of claim 4, wherein the hard mask layer and the first patterned photoresist layer are used as a protection layer during the etching process.

6. The method of claim 1, further comprising forming a liner between the substrate and the filler.

7. The method of claim 1, wherein the first patterned photoresist layer comprises a single layer structure or a multiple layer structure.

8. The method of claim 1, wherein the hard mask layer comprises a single layer structure or a multiple layer structure.

* * * * *